(12) United States Patent
Kaminski

(10) Patent No.: US 6,930,558 B1
(45) Date of Patent: Aug. 16, 2005

(54) PULSE-WIDTH TO VOLTAGE CONVERTER

(75) Inventor: Gerhard Kaminski, Fuerth (DE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/786,496

(22) Filed: Feb. 25, 2004

(51) Int. Cl.[7] .............................................. H03L 7/00
(52) U.S. Cl. ......................................... 331/17; 331/16
(58) Field of Search ............................. 331/10, 14, 16, 331/18, 25, 34, 57

(56) References Cited

U.S. PATENT DOCUMENTS

| | | | | |
|---|---|---|---|---|
| 5,081,427 A | * | 1/1992 | Suarez | 331/10 |
| 5,617,058 A | * | 4/1997 | Adrian et al. | 330/10 |
| 5,629,651 A | * | 5/1997 | Mizuno | 331/34 |
| 6,215,363 B1 | * | 4/2001 | Conta et al. | 331/17 |
| 6,308,049 B1 | * | 10/2001 | Bellaouar et al. | 455/76 |
| 6,642,799 B2 | * | 11/2003 | Tang | 331/16 |

* cited by examiner

Primary Examiner—Michael Tokar
Assistant Examiner—Linh V Nguyen

(57) ABSTRACT

Apparatus for deriving an analog signal from a pulse-width modulated signal, for use in a closed-loop control system such as a phase-locked loop, is arranged to provide non-linear conversion such that the ratio of the magnitude of the analog output signal to the pulse width is greater for larger pulse widths than for smaller pulse widths. In the illustrated apparatus the output signal is derived by an integrator, gated by the pulse-width modulated signals, for integrating, during the duration of a pulse, a signal that increases with time. The increasing signal may be supplied by a positive feedback arrangement from the output of the integrator, or by a feed-forward arrangement from the output of a further gated integrator arranged to integrate a constant signal.

15 Claims, 5 Drawing Sheets

PULSE-WIDTH TO VOLTAGE CONVERTER

TECHNICAL FIELD

This invention relates to pulse-width to voltage converters for use in closed-loop control systems, such as phase-locked loops.

BACKGROUND OF THE INVENTION

For simplicity of description, the following description will be in terms of phase-locked loops in particular, but the invention can be applied to closed-loop control systems in general.

A typical phase-locked loop is shown in FIG. 1. A locally generated signal $\Phi_{out}$ is generated by a voltage-controlled oscillator or voltage-controlled multivibrator 1, whose output signal may, depending on the use to which the phase locked loop is to be put, be reduced in frequency by a programmable counter 2. As an alternative to a voltage-controlled oscillator, a current-controlled oscillator, such as a YIG oscillator, can be employed, but the present description will assume a voltage-controlled oscillator. The reduced-frequency, locally generated signal is then compared in phase with an input signal $\Phi_{in}$ by a phase comparator 3. Suitable phase comparators are well-known in the art, the Motorola MC4044 being an early example, some others being described by Peter Alfke, 'Frequency/Phase Comparator of Phase-Locked Loops', Xilinx Application Note XAPP 028, Dec. 2, 1996. If the locally generated signal leads the input signal in phase, the phase comparator produces, at one output, a series of pulses $\Phi^+$ whose pulse width is proportional to the phase difference. If the locally generated signal lags behind the input signal in phase, the phase comparator produces, at another output, a series of pulses $\Phi^-$ whose pulse width is proportional to the phase difference. The outputs of the phase comparator are applied to a loop filter, which converts the pulse signals to a control voltage $V_c$, which is applied as control input to the voltage-controlled oscillator 1.

Although in FIG. 1 the locally generated signal $\Phi_{out}$ is shown as the output of the phase-locked loop, for some applications, such as FM demodulation, it may be the control voltage $V_c$ which is the desired output.

The loop filter 4 is designed to provide the circuit as a whole with the desired operating characteristics, given the characteristics of the other components.

The principle of the design of such phase-locked loops is well-known. See, for example, Garth Nash, 'Phase-Locked Loop Design Fundamentals', Motorola Semiconductor Application Note AN535 (http://e-www.motorola.com/files/rf_if/doc/app_note/AN535.pdf).

A problem with phase-locked loops is that the loop gain needs to be high to ensure that the system quickly locks on to the input signal (i.e. so that the settling time is short), but if it is too high the system will be too sensitive to noise and short-term variations in the input signal. Therefore, the best loop gain for a phase-locked loop represents a compromise between a short settling time and proper operation once the loop has settled. Ideally, a phase-locked loop would start with a high loop gain during the settling time and the gain would then be reduced.

SUMMARY OF THE INVENTION

A closed-loop control system according to the invention includes a pulse-width to analog converter connected to receive the pulse-width modulated signals $\Phi^+$ and $\Phi^-$ and deriving an analog control signal for the local signal generator. The pulse-width to analog converter is arranged to provide non-linear conversion, whereby the ratio of the amplitude of the analog control signal to the pulse width of the pulse-width modulated signals is greater for larger pulse widths than for smaller pulse widths. Thus, during the settling time, when the errors, and therefore the pulse widths, are larger, the effective loop gain is greater, thus enabling the system to lock on more quickly. When the system has settled, and errors, and therefore pulse widths, are smaller, the effective loop gain is smaller, giving smoother operation in the locked-in state.

A pulse-width to analog converter for use in such a system may comprise an integrator circuit, connected to receive a first analog signal gated by the first pulse-width modulated input signal $\Phi^+$ and a second analog signal, of opposite polarity to the first analog signal, gated by the second pulse-width modulated input signal $\Phi^-$. Each of the first and second analog signals increases in magnitude during each pulse of the respective pulse-width modulated input signal. Thus, the integrated signal increases at a faster than linear rate, providing non-linear relation between the pulse width and the magnitude of the output signal of the integrator circuit.

Such a construction particularly lends itself to the provision for adjustment of the non-linear element of the loop gain independently of the gain at small pulse widths.

BRIEF DESCRIPTION OF THE DRAWING

Some embodiments of the invention will now be described by way of example, with reference to the accompanying drawings, in which.

DETAILED DESCRIPTION

Figure 1:
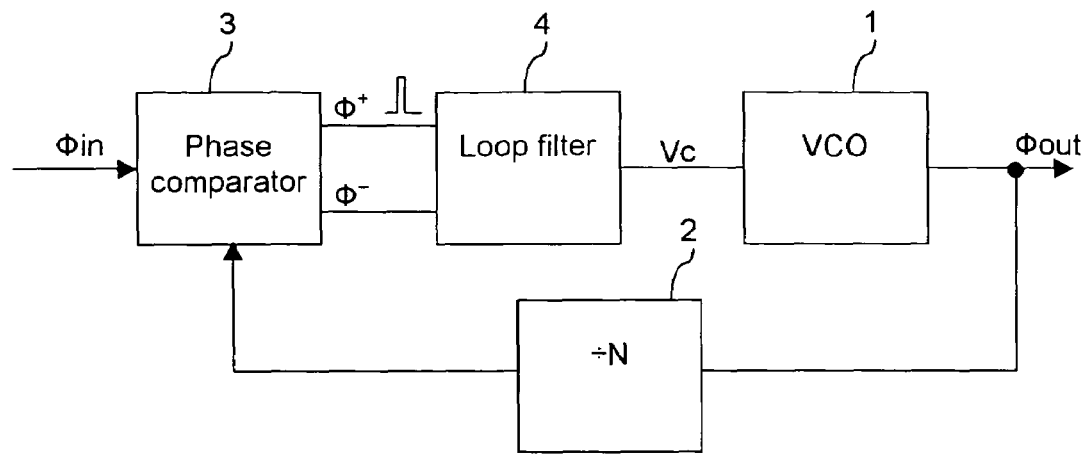
FIG. 1 shows a phase-locked loop as known in the prior art.
Figure 2:
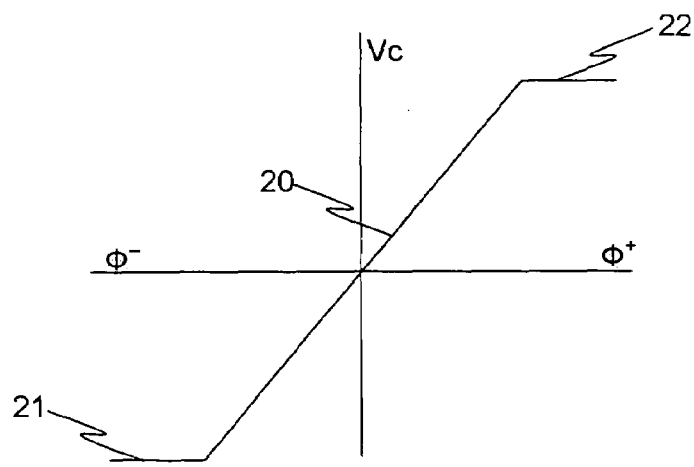
FIG. 2 shows the characteristic of a loop filter in the phase-locked loop of FIG. 1.

FIG. 2 shows the dependence of the control voltage Vc on the phase error in the known phase locked loop of FIG. 1. In fact, because of the loop filter 4 in the circuit of FIG. 1, the control voltage Vc is not a function of the instantaneous value of the phase error, but is time dependent. However, FIG. 2 shows that the response of the control voltage Vc to the phase error is linear over most of the range of the phase error, but saturates at the extreme values of the range 21, 22.

Figure 3:
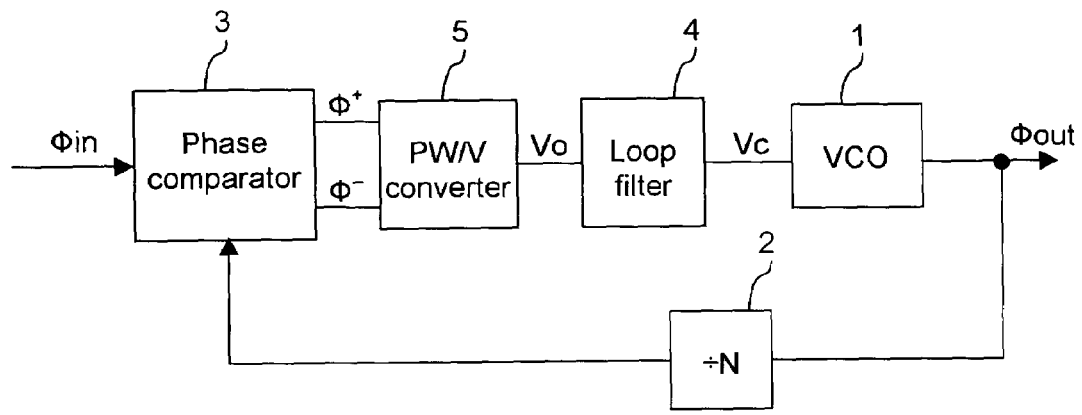
FIG. 3 shows a phase-locked loop including a pulse-width to voltage converter according to the invention.
Figure 4:
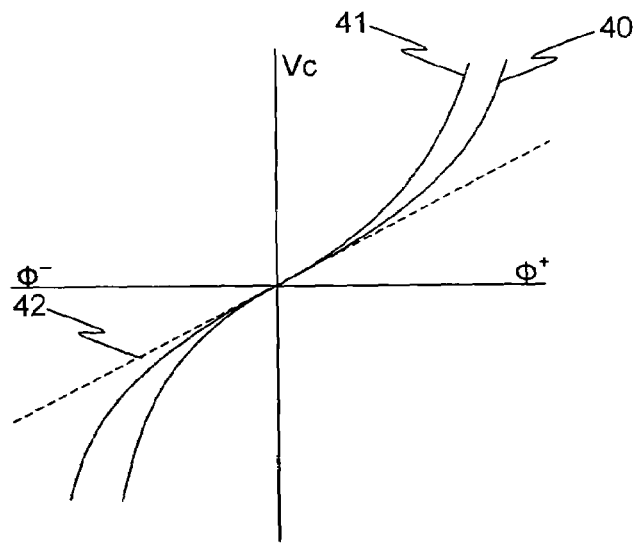
FIG. 4 shows the characteristic of a pulse-width to voltage converter according to the invention.

FIG. 3 shows a phase locked loop circuit similar to that of FIG. 1, except that a pulse width to voltage converter 5 is inserted between the phase comparator 3 and the loop filter 4. The response characteristic 40 of the pulse width to voltage converter 5 is shown in FIG. 4. The pulse width to voltage converter 5 produces an output voltage Vo which varies in a nonlinear fashion with the phase error. The characteristic is such that the ratio of the output voltage Vo to the phase error is greater for larger magnitudes of the phase error than for smaller magnitudes. In the embodiment to be described, the characteristic of the pulse width to voltage converter 5 is adjustable so that the nonlinear component can be adjusted independently of the linear component. Thus, the characteristic 40 may be changed to a characteristic 41, which is more nonlinear than the characteristic 40, in the sense that the ratio of output voltage Vo to the phase error at higher values of the phase error is greater. However, the adjustment is such that the linear component 42 of the characteristic is unchanged, so the response of the converter for small values of the phase error is unchanged.

Figure 5:
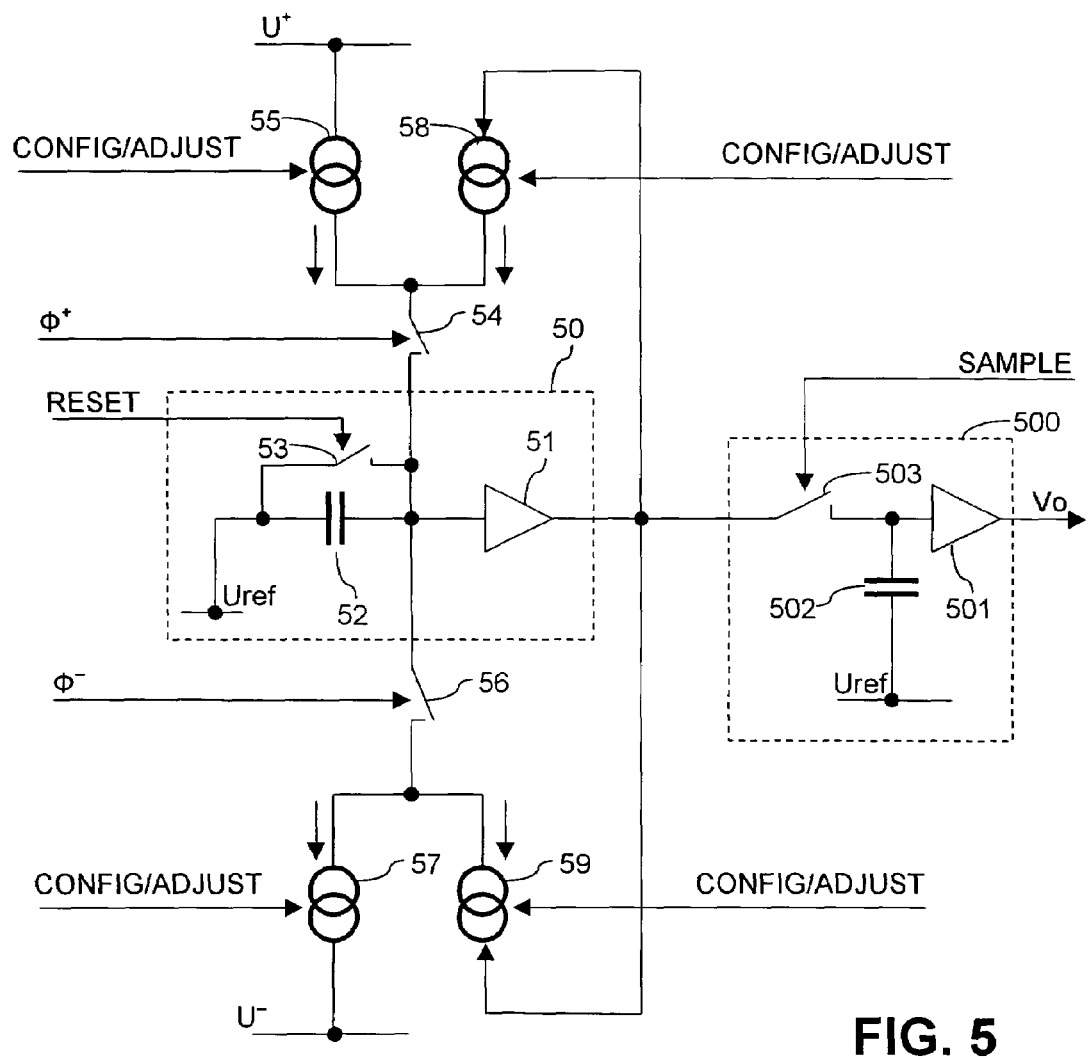
FIG. 5 shows a first embodiment of a pulse-width to voltage converter according to the invention, employing a feed-back configuration.

FIG. 5 shows a first embodiment of a pulse width to voltage converter suitable for use in the phase locked loop of FIG. 3. At the heart of the circuit shown in FIG. 5 is an integrator 50. The integrator 50 comprises a buffer amplifier 51 and a capacitor 52 connected between the input of the buffer amplifier 51 and a reference voltage Uref. An electronic switch 53, controlled by a reset input, is connected across the capacitor 52 to reset the integrator 50. The buffer amplifier 51 is a unity-gain amplifier with high input impedance and a low output impedance. For example, the buffer amplifier 51 may be an emitter follower consisting of either a bipolar transistor or a combination of an FET and a bipolar transistor. The input of the buffer amplifier 51, which forms the input of the integrator 50, is connected via an electronic gating switch 54, controlled by the pulse signal from the first output $\Phi^+$ of the phase comparator 3, to a current source 55 which supplies a constant current as an input signal. The input to the integrator 50 is also connected, via a second electronic gating switch 56, to a second current source 57, which supplies a constant current of opposite polarity to that supplied by the current source 55. The second electronic gating switch 56 is connected to receive the pulse signal from the second output $\Phi^-$ of the phase comparator 3.

The output of the buffer amplifier 51, which forms the output of the integrator 50, is connected via a third current source 58 to the input of the integrator 50 via the first gating switch 54, as a positive feedback connection. Thus, during the duty cycle of the first pulse signal $\Phi^+$, when the first gating switch 54 is closed, the input to the integrator 50 consists of a constant current from the first current source 55 plus a feedback current from the third current source 58, and the output of the integrator 50 increases, initially at a rate which depends on the transconductance of the first current source 55, and then exponentially at a rate which depends on the transconductance of the third current source 58.

Similarly, the output of the integrator 50 is fed back via a fourth current source 59, similar to the third current source 58, but providing a current of the opposite polarity, via the second gating switch to the input of the integrator 50. Thus, during the duty cycle of the second pulse signal $\Phi^-$, the input to the integrator 50 consists of a negative constant current, from the second current source 57 plus a negative current whose magnitude increases exponentially, from the fourth current source 59.

When the duty cycle of the first pulse signal $\Phi^+$ is small, corresponding to a small positive phase error, the output of the integrator 50 will increase to a level which is proportional to the duty cycle of the first pulse signal, the constant of proportionality depending on the transconductance of the first current source 55. On the other hand, when the duty cycle of the first pulse signal $\Phi^+$ is larger, the output of the integrator will increase to a value which is greater, owing to the exponential increase in the input current to the integrator 50. Thus, the ratio of the output of the integrator 50 to the duty cycle of the first pulse signal will be greater when the duty cycle is larger than when it is smaller.

The output of the integrator 50 is connected to a conventional sample and hold circuit 500, consisting of a unity gain buffer amplifier 501, similar to the amplifier 51, a capacitor 502, connected between the input of the buffer amplifier 501 and a reference voltage, and an electronic switch 503 connected between the input of the sample and hold circuit 500 and the input of the buffer amplifier 501.

In operation, the sample and hold circuit 500 is periodically activated by momentarily closing the electronic switch 503, and the integrator 50 immediately reset by momentarily closing the electronic switch 53. Thus, the output voltage Vo of the circuit of FIG. 5 represents the response of the integrator 50 to a predetermined number of pulses of the first pulse signal $\Phi^+$ or the second pulse signal $\Phi^-$, depending on whether the phase error is positive or negative.

Figure 6:
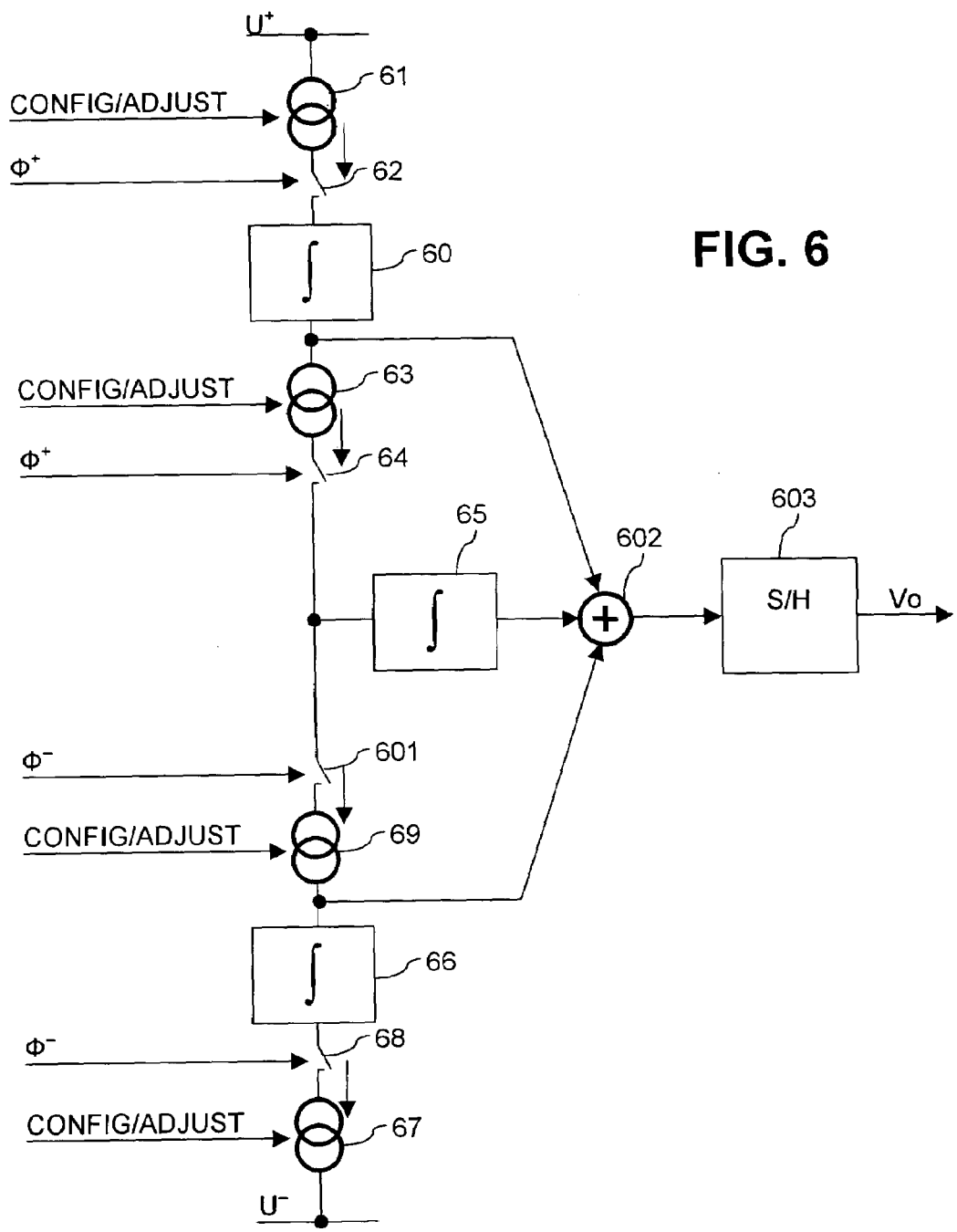
FIG. 6 shows, in schematic form, a second embodiment of a pulse-width to voltage converter, employing a feed-forward configuration

FIG. 6 shows an alternative embodiment of a pulse width to voltage converter according to the invention and suitable for use in the phase locked loop circuit of FIG. 3. A first integrator 60 is connected to receive a constant current signal from a first current source 61 gated by a first gating switch 62 which is connected to the first pulse signal $\Phi^+$. The output of the first integrator 60 is connected to a second current source 63 and the output of the second current source 63 is connected via a second gating switch 64, also connected to receive the first pulse signal $\Phi^+$, to an input of a second integrator 65. Similarly, a third integrator 66 is connected to receive a constant current from a third current source 67 via a third gating switch 68 which is connected to receive the second pulse signal $\Phi^-$. The current from the third current source 67 is of the opposite polarity to the current supplied by the first current source 61. The output of the third integrator 66 is connected to a fourth current source 69 of which the output is connected via a fourth gating switch 601, also connected to receive the second pulse signal $\Phi^-$ to the input of the second integrator 65. The outputs of the integrators 60, 65 and 66 are connected to inputs of an analog adding circuit 602 and the output of the adding circuit is connected to a sample and hold circuit 603, the output of which is the output Vo of the pulse width to voltage converter circuit.

The integrators 60, 65 and 66 are identical to the integrator 50 of FIG. 5, and the sample and hold circuit 603 is identical to the sample and hold circuit 500 of FIG. 5.

During the duty period of the first pulse signal $\Phi^+$, while the first gating switch 62 is closed, the first integrator 60 receives a constant input signal, so the output of the first integrator 60 increases linearly with time. Thus the output of the first integrator 60 is proportional to the duty cycle of the first pulse signal $\Phi^+$, and therefore is proportional to the phase error. During a duty period of the first pulse signal $\Phi^+$ the input to the second integrator 65 is proportional to the output of the first integrator 60, i.e. it is linearly increasing, so the output of the second integrator 65 increases quadratically with time during the duty period of the first pulse signal $\Phi^+$. Thus, the sum of the outputs of the first and second integrator 60,65, produced by the adder circuit 602, increases quadratically with the duty cycle of the first pulse signal $\Phi^+$ and thus with the phase error, having a linear response at small values of the phase error which is controlled by the transconductance of the first current source 61, and a quadratic term which is controlled by the transconductance of the second current source 63. Similarly, when the phase error is negative the sum of the outputs of the integrators 65 and 66, formed by the adder circuit 602, has a linear term controlled by the transconductors of the third current source 67 and a quadratic term controlled by the transconductance of the fourth current source 69.

The triggering of the sample and hold circuit 603 and the resetting of the integrators 60, 65 and 66 is controlled in the same way as the triggering of the sample and hold circuit 500 and the resetting of the integrator 50 in the circuit of FIG. 5.

Figure 7:
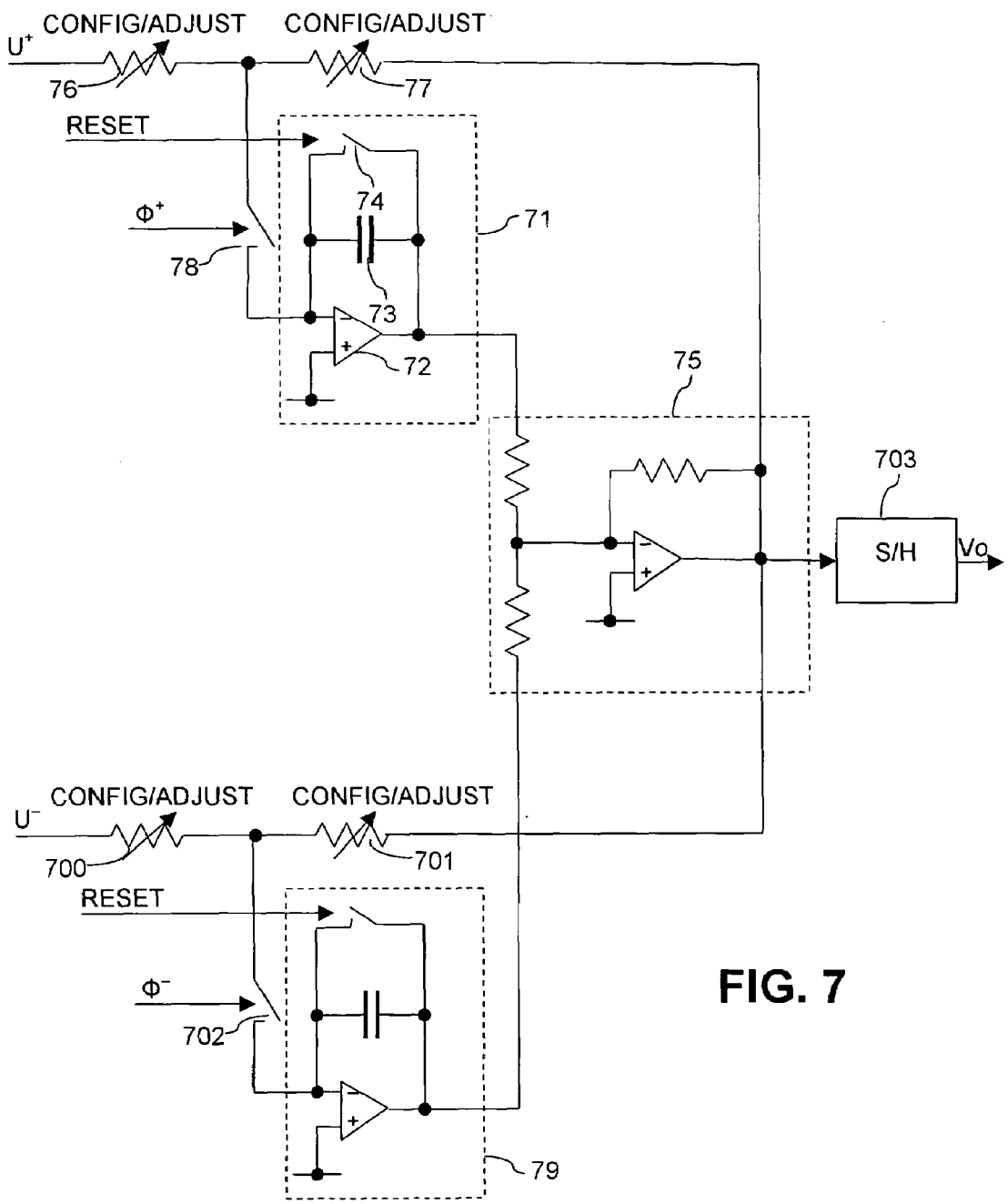
FIG. 7 shows an alternative implementation of a pulse-width to voltage converter according to the invention, similar to that of FIG. 5 but using operational amplifiers.

FIG. 7 shows an alternative implementation of a pulse width to voltage converter according to the invention and using a feedback configuration similar to that of the circuit of FIG. 5, but using operational amplifiers instead of current sources and simple buffer amplifiers. A first integrator 71 comprises an operational amplifier 72 and a capacitor 73 connected between the output of the operational amplifier 72 and its inverting input. A resetting switch 74 is connected across the capacitor 73. The output of the operational amplifier 72, which forms the output of the first integrator 71, is connected to one input of a conventional operational amplifier adder circuit 75. The input to the first integrator 71 is supplied by a first variable resistor 76 connected to a constant voltage source and a second variable resistor 77 connected to the output of the adder circuit 75, both connected via a first gating switch 78 controlled by the first pulse signal $\Phi^+$.

Similarly, a second integrator 79, identical to the first integrator 71, has an output connected to an input of the adder circuit 75, and an input connected via a second gating switch 702, controlled by the second pulse signal $\Phi^-$, to a third variable resistor 700 connected to a negative constant voltage source and a fourth variable resistor 701 connected to the output of the adder circuit 75. The output of the adder circuit 75 is also connected to the input of a sample and hold circuit 703.

The circuit of FIG. 7 operates in the same way as the circuit in FIG. 5, producing an output which varies faster than linearly with the phase error, owing to the positive feedback connections between the output of the adder circuit 75 and the integrators 71 and 79. The response at small levels of the phase error is adjustable by means of the first and third variable resistors 76 and 700 and the nonlinear portion of the response is adjustable by means of the second variable resistor 77 and the fourth variable resistor 701, independently of the slope of the characteristic at small levels of the phase error.

It is presently preferred to use an implementation, such as that of FIG. 5, employing current sources, rather than an implementation, as shown in FIG. 7, using operational amplifiers, because current sources have the advantage over operational amplifiers of low noise, simplicity, and ease of integration, particularly since the output stages of most phase lock loop phase detectors at present are designed using current source technology.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

I claim:

1. Apparatus for deriving an analog output signal from an input signal consisting of a first pulse-width modulated input signal representing positive values and a second pulse-width modulated input signal representing negative values, comprising:

an integrator circuit, connected to receive a first analog signal gated by the first pulse-width modulated input signal and a second analog signal, of opposite polarity to the first analog signal, gated by the second pulse-width modulated input signal;

each of said first and second analog signals increasing in magnitude during each pulse of the respective pulse-width modulated input signal.

2. The apparatus of claim 1 further comprising means for resetting said integrator circuit, wherein operation of said resetting means also resets said first and second analog signals to respective initial values.

3. The apparatus of claim 2 further comprising a sample-and-hold circuit connected to an output of the integrator circuit.

4. The apparatus of claim 3 further comprising:

means for generating first and second constant signals of opposite polarity;

feedback means connected to an output of said integrator circuit for generating a first feedback signal having the polarity of said first constant signal and a second feedback signal having the polarity of said second constant signal, said feedback signals being proportional to said output of said integrator circuit and having a feedback gain;

means for adding said first constant signal to said first feedback signal to provide said first analog signal; and means for adding said second constant signal to said second feedback signal to provide said second analog signal.

5. The apparatus of claim 4 further comprising:

means for adjusting the values of said first and second constant signals; and means for adjusting said feedback gain independently of said adjustment of said values of the constant signals.

6. The apparatus of claim 3 further comprising:

a first further integrator circuit connected to receive a first constant signal gated by said first pulse-width modulated input signal;

a second further integrator circuit connected to receive a second constant signal, of opposite polarity to said first constant signal, gated by said second pulse-width modulated input signal;

first feed-forward means, connected to an output of said first further integrator circuit, for deriving said first analog signal, and having a feed-forward gain;

second feed-forward means, connected to an output of said second further integrator circuit, for deriving said second analog signal, and having a feed-forward gain; and adding means for adding an output signal of said integrator circuit, an output signal of said first further integrator circuit and an output signal of said second further integrator circuit;

wherein said resetting means is operative to reset said first and second further integrator circuits.

7. The apparatus of claim 6 further comprising:

means for adjusting the values of said first and second constant signals; and means for adjusting the feed-forward gains of said feed-forward means, independently of said adjustment of the values of said constant signals.

8. A closed-loop control system comprising:
a local signal generator for generating a locally generated signal;
a comparator for comparing said locally generated signal with an input signal to derive an error signal consisting of a first pulse-width modulated signal representing positive error values and a second pulse-width modulated signal representing negative error values; and
a pulse-width to analog converter connected to receive said pulse-width modulated signals for deriving therefrom an analog control signal for said local signal generator;
said pulse-width to analog converter being arranged to provide non-linear conversion, whereby the ratio of the amplitude of the analog control signal to the pulse width of the pulse-width modulated signals is greater for larger pulse widths than for smaller pulse widths.

9. The closed-loop control system of claim 8 wherein the pulse-width to analog converter comprises:
an integrator circuit, connected to receive a first analog signal gated by the first pulse-width modulated input signal and a second analog signal, of opposite polarity to the first analog signal, gated by the second pulse-width modulated input signal;
each of said first and second analog signals increasing in magnitude during each pulse of the respective pulse-width modulated input signal.

10. The closed-loop control system of claim 9 wherein said pulse-width to analog converter further comprises:
means for resetting said integrator circuit, wherein operation of said resetting means also resets said first and second analog signals to respective initial values.

11. The closed-loop control system of claim 10 wherein said pulse-width to analog converter further comprises a sample-and-hold circuit connected to an output of the integrator circuit.

12. The closed-loop control system of claim 11 wherein said pulse-width to analog converter further comprises:
means for generating first and second constant signals of opposite polarity;
feedback means connected to an output of said integrator circuit for generating a first feedback signal having the polarity of said first constant signal and a second feedback signal having the polarity of said second constant signal, said feedback signals being proportional to said output of said integrator circuit and having a feedback gain;
means for adding said first constant signal to said first feedback signal to provide said first analog signal; and
means for adding said second constant signal to said second feedback signal to provide said second analog signal.

13. The closed-loop control system of claim 12 wherein said pulse-width to analog converter further comprises:
means for adjusting the values of said first and second constant signals; and
means for adjusting said feedback gain independently of said adjustment of said values of the constant signals.

14. The closed-loop control system of claim 11 wherein said pulse-width to analog converter further comprises:
a first further integrator circuit connected to receive a first constant signal gated by said first pulse-width modulated input signal;
a second further integrator circuit connected to receive a second constant signal, of opposite polarity to said first constant signal, gated by said second pulse-width modulated input signal;
first feed-forward means, connected to an output of said first further integrator circuit, for deriving said first analog signal, and having a feed-forward gain;
second feed-forward means, connected to an output of said second further integrator circuit, for deriving said second analog signal, and having a feed-forward gain; and
adding means for adding an output signal of said integrator circuit, an output signal of said first further integrator circuit and an output signal of said second further integrator circuit;
wherein said resetting means is operative to reset said first and second further integrator circuits.

15. The closed-loop control system of claim 14 wherein said pulse-width to analog converter further comprises:
means for adjusting the values of said first and second constant signals; and
means for adjusting the feed-forward gains of said feed-forward means, independently of said adjustment of the values of said constant signals.

* * * * *